United States Patent
Humayun et al.

(10) Patent No.: US 6,715,498 B1
(45) Date of Patent: Apr. 6, 2004

(54) METHOD AND APPARATUS FOR RADIATION ENHANCED SUPERCRITICAL FLUID PROCESSING

(75) Inventors: Raashina Humayun, San Jose, CA (US); Patrick Christopher Joyce, Fremont, CA (US); Vishal Gauri, San Jose, CA (US); Adrianne Kay Tipton, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/236,613

(22) Filed: Sep. 6, 2002

(51) Int. Cl.7 .................................. B08B 7/04
(52) U.S. Cl. ................ 134/1.3; 134/1; 134/16; 134/19; 134/902; 134/105; 250/492.2
(58) Field of Search ................. 134/184, 200, 134/105, 1, 1.3, 2, 19, 42, 10, 12, 30, 902, 16, 17, 26; 250/455.11, 492.1, 492.2

(56) References Cited

U.S. PATENT DOCUMENTS

| | | | |
|---|---|---|---|
| 5,013,366 A | 5/1991 | Jackson et al. ............... 134/1 |
| 5,068,040 A | 11/1991 | Jackson ..................... 210/748 |
| 5,677,113 A * | 10/1997 | Suzuki et al. ............... 430/329 |
| 5,703,374 A * | 12/1997 | Caprari ..................... 250/492.2 |
| 5,996,155 A | 12/1999 | Chao et al. ..................... 8/158 |
| 6,479,946 B2 * | 11/2002 | Kai et al. ..................... 315/246 |
| 2002/0108632 A1 * | 8/2002 | Yin ............................. 134/1.1 |
| 2002/0166256 A1 * | 11/2002 | Samoilov et al. ............. 34/406 |

OTHER PUBLICATIONS

U.S. Patent Application No. 10/067,520, entitled "Apparatus and Methods for Processing Semiconductor Substrates Using Supercritical Fluids", by Inventors Shrinivasan et al., filed Feb. 5, 2002.

U.S. Patent Application No. 10/099,555, entitled "Method and Apparatus to Remove Additives and Contaminants from a Supercrtical Processing Solution", by Inventors Humayun et al., filed Mar. 13, 2002.

U.S. Patent Application No. 10/125,614, entitled "Supercritical Solutions for Cleaning Wafers", by Inventors Reinhardt et al., filed Apr. 18, 2002.

U.S. Patent Application No. 10/159,951, entitled "Method for Removing Photoresist and Post–Etch Residue Using Activated Peroxide Followed by Supercritical Fluid Treatment", by Inventors Tipton et al., filed May 30, 2002.

U.S. Application No. 10/202,987, entitled "Supercritical Solutions for Cleaning Photoresist and Post–Etch Residue from Low–K Materials", by Inventors Joyce et al., filed Jul. 23, 2002.

* cited by examiner

Primary Examiner—Alexander Markoff
(74) Attorney, Agent, or Firm—Beyer Weaver & Thomas, LLP

(57) ABSTRACT

A supercritical process vessel with an interior for holding a supercritical fluid is provided. A wafer support for supporting a wafer within the interior of a supercritical process vessel to expose the wafer to the supercritical fluid is provided. A lamp, which is able to operate at supercritical fluid pressures within the interior of the supercritical process vessel is provided.

18 Claims, 2 Drawing Sheets

METHOD AND APPARATUS FOR RADIATION ENHANCED SUPERCRITICAL FLUID PROCESSING

FIELD OF THE INVENTION

This invention relates to methods for processing semiconductor wafers. More specifically, the invention relates to methods for processing wafers in a hybrid supercritical fluid processing vessel.

BACKGROUND OF THE INVENTION

Modern VSLI semiconductor processing presents numerous engineering dilemmas. One important issue involves removal of contamination before, during, and after fabrication steps. For example, photoresist strip and residue removal are critical processes in integrated circuit (IC) fabrication. During dielectric etching in a typical integrated circuit fabrication process, undesirable etch residues and/or polymers such as hydrocarbon, fluorocarbon, and/or polymeric residues (e.g. $C_xH_xF_xO_x$) are formed and left on the surfaces and sidewalls of the resulting structures. Such undesirable residues along with the remaining post-etch photoresist must be removed to prevent quality issues in subsequent deposition: process, such as adhesion problems, and/or diffusion contamination.

One common method to remove such residues is plasma stripping; however, plasma stripping is often damaging to advanced low-k materials. Consequently, non-plasma methods for removing photoresist, residue, and other contaminants from semiconductor substrates are needed.

Conventional non-plasma methods for removal of, for example, post-etch photoresist and polymer residue (especially over low-k dielectrics) present numerous challenges. Traditional wet chemical cleaning methods use solvents such as NMP, along with amines (e.g., hydroxylamine) to strip resist and remove sidewall residue. However, such wet solvent processes require a deionized (DI) water rinse to remove traces of solvent from the features that have been etched into the dielectric. As feature sizes are reduced, and their aspect ratio increases, penetration of DI water and liquid solvents into these features becomes more difficult due to surface tension issues. Also, if liquids do penetrate into such small features, then it becomes increasingly difficult to subsequently remove. Consequently, wet processes have limitations in cleaning residue from the bottom of high-aspect ratio features with small lateral dimensions. Additionally, these wet cleaning methods can over etch exposed layers. This can cause device reliability problems or lead to nonfunctional circuits. And although the oxidative chemistry component of some traditional wet clean methods (e.g. dilute HF (50:1–1000:1 $HF:H_2O$) or "hot Piranha" (90% $H_2SO_4$/10% $H_2O_2$)) can be effective at cleaving the bonding structures of contaminant residues, often the formulations and or cleaning conditions do not provide efficient physical removal of the contaminants. These methods also have the disadvantage of requiring handling and exposure to corrosive and flammable media, thus requiring extensive abatement and environmental controls.

Also, there are a number of emerging methods for cleaning wafers, such as densified fluids. Densified fluids are good solvents for contaminants and residues resulting from semiconductor fabrication. Some of these processes, especially those conducted at supercritical pressures, employ additives to increase the solvating power of the process fluid itself. Other additives are used to remove specific contaminants such as polymers, organics, metals, and the like. Although supercritical fluids hold promise for wafer processing, more can be done to exploit their valuable physical properties.

During such processes, a UV light may be used to generate free radicals to facilitate photoresist and post etch residue removal. During such processes, UV light is supplied to a supercritical process vessel via a high pressure window in a wall of the supercritical process vessel. The UV light passes through the window to illuminate an area adjacent to the wafer. One problem with this approach is that the window needs to be thick enough and strong enough to survive supercritical pressures; such windows attenuate some of the UV light. Also, by having the UV source outside of the vessel, thorough exposure of the workpiece is problematic.

It is desirable to provide a supercritical process vessel that provides improved UV irradiation of a wafer surface.

SUMMARY OF THE INVENTION

To achieve the foregoing and in accordance with the purpose of the present invention, a method for processing a wafer is provided. The wafer is placed within a supercritical process vessel. A light source is activated, where the light source is within the supercritical process vessel. A supercritical fluid is introduced into the supercritical process vessel, where the light source is exposed to the supercritical fluid.

In another embodiment of the invention, an apparatus for processing a wafer is provided. A supercritical process vessel with an interior for holding a supercritical fluid is provided. A wafer support for supporting a wafer within the interior of a supercritical process vessel to expose the wafer to the supercritical fluid is provided. A lamp, which is able to operate at supercritical fluid pressures within the interior of the supercritical process vessel to expose the lamp to the supercritical fluid is provided.

BRIEF DESCRIPTION OF THE DRAWINGS

The invention, together with further advantages thereof, may best be understood by reference to the following description taken in conjunction with the accompanying drawings in which.

In the Figures, like reference numerals refer to like components and elements.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In some descriptions herein, well-known processes, procedures, and components have not been described in detail so as not to unnecessarily obscure aspects of the present invention.

In this application, the term "wafer" is used extensively. The term "wafer" generally refers to a semiconductor wafer as such wafer exists during any of many stages of integrated circuit fabrication thereon. Generally, the wafer would refer to semiconductors formed on a working surface of the wafer. Films may be deposited on the working surface and thus form part of the wafer. A part of the discussion herein focuses on wafer cleaning operations; it is meant that cleaning and removing generally mean the same thing. One skilled in the art would generally refer to "cleaning" a substrate, and "removing" deposited materials. Preferably, the invention is used to remove contaminants (e.g. polymer residue) and/or remove deposited materials (e.g. photoresist) from wafers. Also, deposition of films or altering the properties of a film on a wafer will also be discussed.

Supercritical fluids or solutions exist when the temperature and pressure of a solution are above its critical temperature and pressure. In this state, there is no differentiation between the liquid and gas phases and the fluid is referred to as a dense gas in which the saturated vapor and saturated liquid states are identical. Near supercritical fluids or solutions exist when the temperature and pressure of a solution are both greater than 80% of their critical point, but the solution is not yet in the supercritical phase. Due to their unique properties, supercritical fluids are useful for a wide variety of processes. Of particular interest is the extremely low surface tension making the supercritical fluid ideal for work involving very small features. In this application, when a fluid, solvent, or other solution is referred to as "supercritical", it is understood to describe both supercritical and near supercritical conditions. In this application, the term "supercritical fluid" refers to the supercritical form of a solvent and optionally one or more solutes. Note that a supercritical fluid may include mixtures of solvents and/or other additives.

Figure 1:
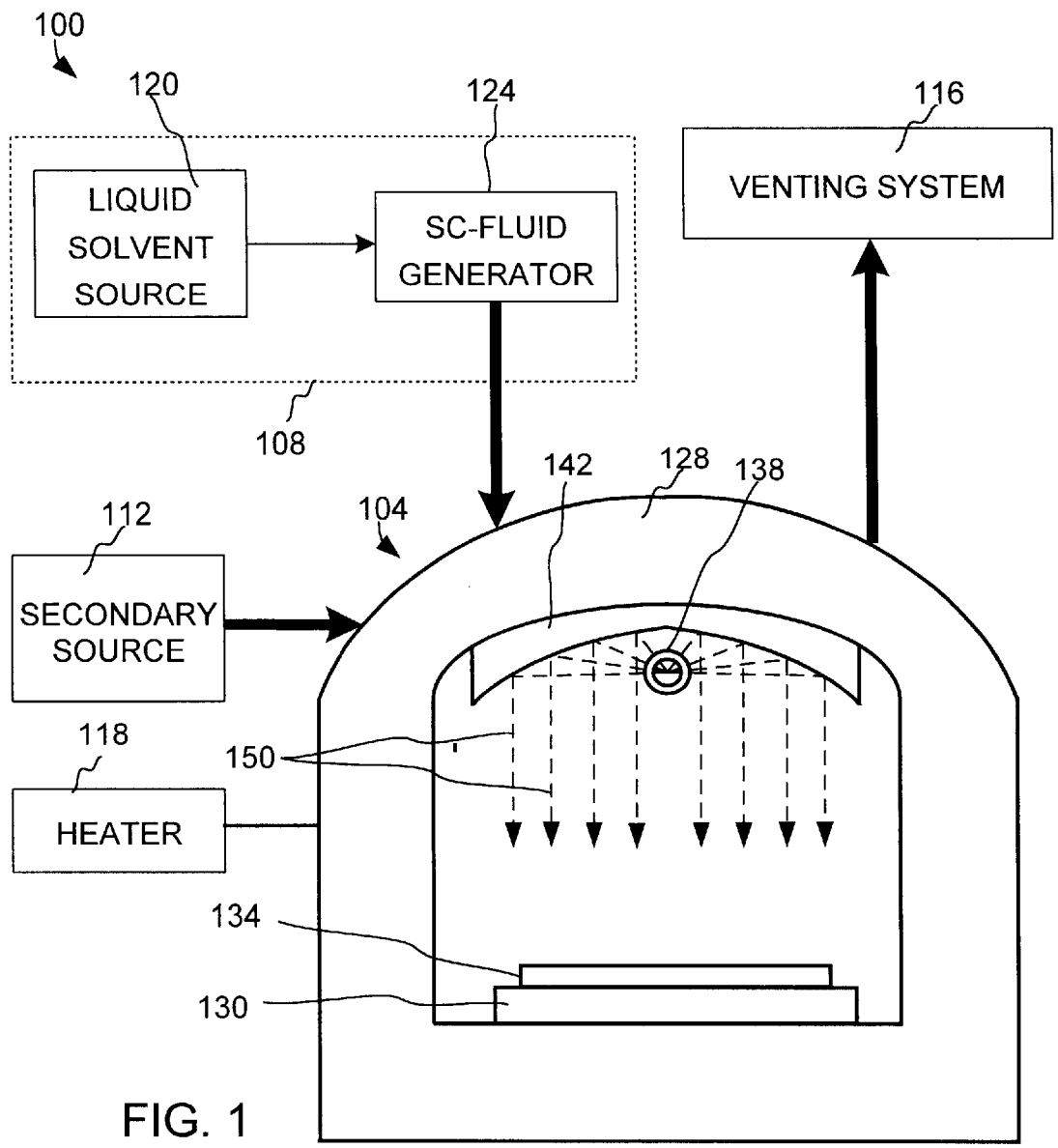
FIG. 1 is a diagrammatic view of a system for a preferred embodiment of the invention.

To facilitate understanding, FIG. 1 is a diagrammatic view of a system 100 for a preferred embodiment of the invention. A supercritical process vessel 104 is connected to a supercritical fluid source 108, a secondary source 112, a venting system 116, and a heater 118. The supercritical fluid source 108 comprises a liquid solvent source 120 and a supercritical fluid generator 124. The supercritical process vessel 104 comprises a vessel wall 128, a wafer support 130 for supporting a wafer 134, a lamp 138, and a reflector 142.

Figure 2:
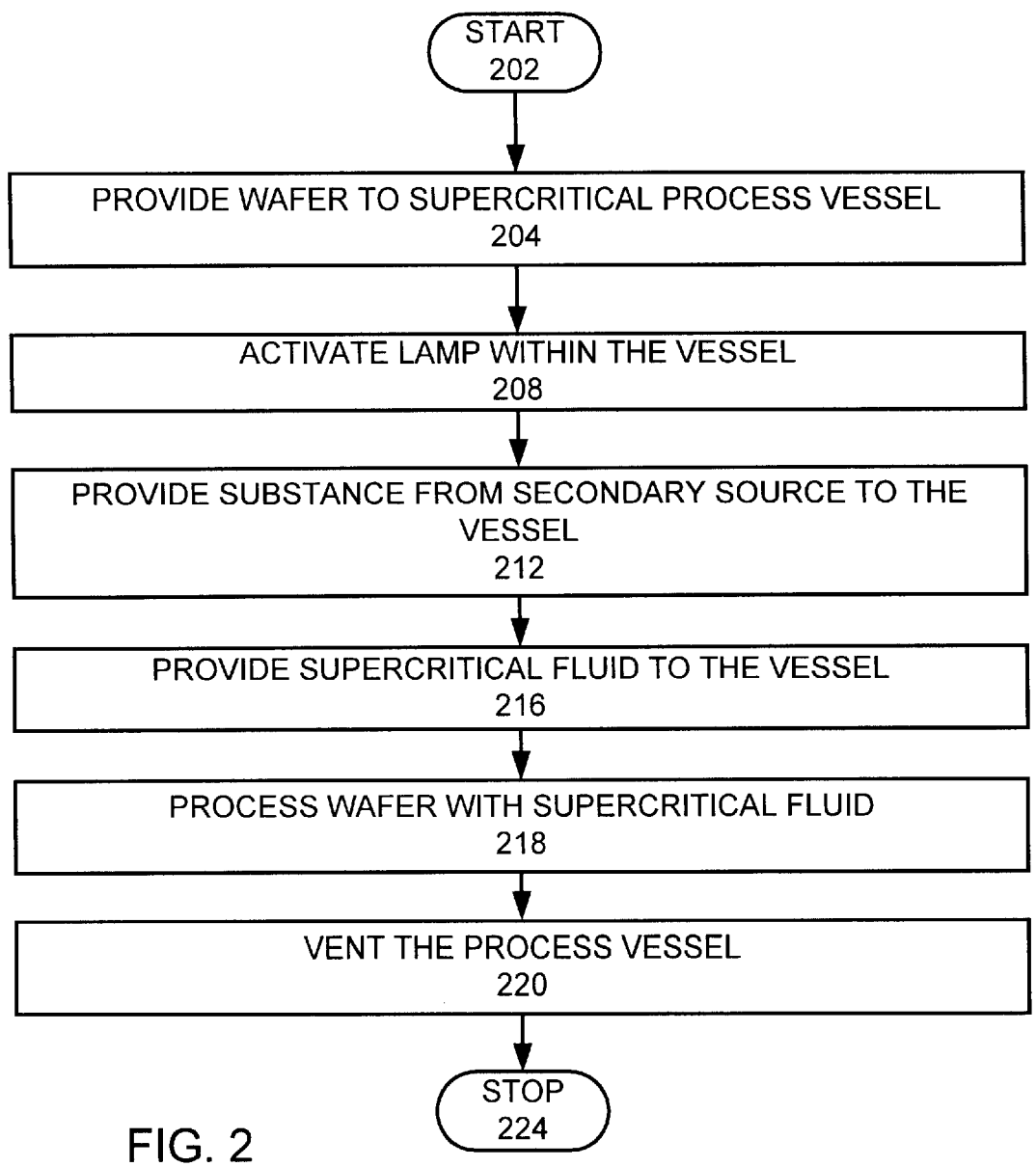
FIG. 2 is a high level flow chart of a process that uses the system shown in FIG. 1.

FIG. 2 is a high level flow chart of a process that uses the system 100. A wafer 134 is mounted on the wafer support 130 of the supercritical process vessel 104 (step 204). The lamp 138 is activated within the process vessel 104 (step 208) to provided radiation energy (e.g. UV light). A substance may be provided by the secondary source 112 directly to the process vessel 104 (step 212). A supercritical fluid is provided by the supercritical fluid source 108 to the process vessel 104 (step 216). The wafer 134 is processed by the supercritical fluid (step 218). Such processes may use the supercritical fluid alone or in combination with a substance from the secondary source to strip photoresist, or remove residue, etch the wafer, deposit a film or alter the properties of a film. The light may interact with the supercritical fluid to generate an active species which then interacts with the work surface of the wafer. The light may also facilitate the breakdown of specific chemical bonds in a film or portions of a film. The process vessel 104 may then be vented (step 220). In other embodiments, a substance from a secondary source may not be used. The steps of providing UV light, providing a substance from a secondary source, and providing the supercritical fluid may be provided in simultaneously or sequentially or in a different order. The heater 118 is used to maintain the supercritical fluid to a preferred temperature above 35° C. Such a temperature helps to keep the fluid supercritical. Higher temperatures may be used to increase processing speeds. Although the heater 118 is shown as being connected directly to the process vessel 104, in other embodiments, the heater may be part of the supercritical fluid source 108, heating the supercritical fluid before the supercritical fluid is provided to the process vessel. In all such cases, the supercritical fluid is directly or indirectly heated to the preferred temperature.

Figure 3:
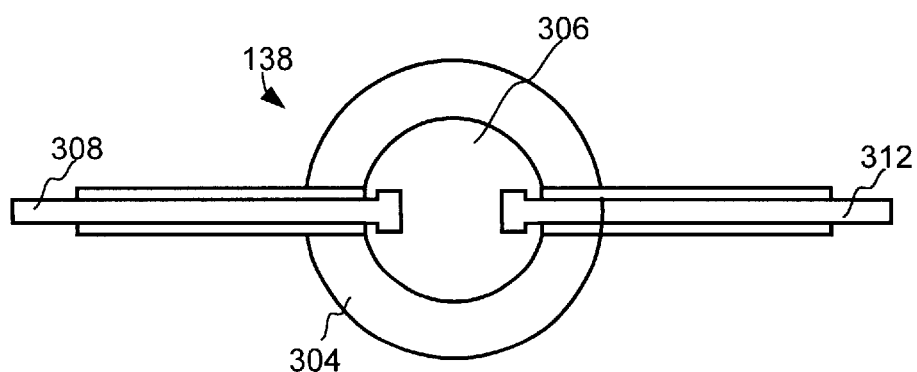
FIG. 3 is a cross-sectional view of a UV lamp that may be used in the preferred embodiment of the invention.

FIG. 3 is a cross-sectional view of a lamp 138 that may be used in the preferred embodiment of the invention. The lamp 138 has a transparent shell 304 forming a lamp chamber 306. A first electrode 308 and a second electrode 312 extend into the shell 304. Preferably, the first and second electrodes 308, 312 are tungsten and the shell 304 is quartz and spherical so that it will be able to be subjected to pressures of a supercritical fluid within the supercritical process vessel 104. In this preferred embodiment, the first electrode 308 is separated from the second electrode 312 by a small gap to form a short arc, which provides light from a small area (between the electrodes) and thus may be considered a point source of light for certain uses. Preferably, the gap size is between 1–5 mm. In a preferred embodiment, the reflector 142 is a three-dimensional parabola, with the lamp chamber 306 of the lamp 138 located at the focal point of the three-dimensional parabola. In such an embodiment, the light from the lamp 138 would provide a substantially even intensity across a surface of the wafer, since light from the focal point would provide substantially parallel rays 150, as shown in FIG. 1. A xenon vapor or a vapor from a rare earth element may be provided in the lamp chamber 306 in the shell 304 to provide a UV light source. A vapor of a mixture of xenon and mercury vapor may be provided in the lamp chamber 306 to provide a light source of a desired wavelength. The light source would preferably provide a light with a wavelength range that includes 40 to 800 nm. More preferably, the radiation from the high intensity discharge lamp provides intensity peaks of wavelengths between 90 and 400 nm. Most preferably, the UV light provides wavelength intensity peaks of between 90 and 250 nm. Preferably, such a UV light source can withstand supercritical pressure and temperatures associated with supercritical fluid processing. For example, pressures above 1200 psi and temperatures above 30° C. are used for supercritical carbon dioxide. Most preferably, the UV light source would be able to be used at pressures above 5000 psi and temperatures above 100° C. The spherical thick wall of high purity quartz forming the chamber helps the UV lamp to function at supercritical pressures and temperatures. In addition, for high intensity discharge lamps, an operating pressure is of the order of 1500 to 3000 psi and thus the pressure differential across the walls of the lamp during operation is significantly reduced. The lamp chamber may have an outer diameter of 10–15 mm and a wall thickness of 3–5 mm. In the preferred embodiment the pure quartz has less than 50 ppm impurities. In other embodiments, the lamp wall may be made of translucent or transparent ceramic materials, high purity Polycrystalline Alumina (PCA), or sapphire).

Additional lamps may be placed within the interior of the vessel, to form an array of lamps within the interior of the vessel and subjected to a supercritical fluid environment.

EXAMPLES

Example 1

In one example of a preferred embodiment, a wafer is provided to a supercritical process vessel (step 204), a supercritical fluid is added from the SCF generator (step 216) and the secondary source first provides a peroxide-containing medium (step 212). Preferred supercritical fluids include at least one of carbon dioxide, ammonia, water, ethane, propane, butane, dimethyl ether, hexafluoroethane, $SF_6$, ethylene, $N_2O$, Xe, and mixtures thereof. Preferably, the supercritical fluid is mixed with the peroxide containing medium and is applied to the wafer work surface at a pressure of between about 1200 and 5000 psi, and at a temperature of between about 20° C. and 150° C.

The lamp 138 is activated to provide an excitation energy (step 208), which is applied to the supercritical fluid—peroxide solution, while it is in contact with the wafer work surface. The excitation energy is applied to the peroxide in the supercritical fluid, it may also act on the wafer work surface which is in contact with the peroxide containing supercritical fluid. The excitation energy applied is sufficient to generate corresponding hydroxy and peroxy radicals from interaction with the peroxide-containing supercritical fluid. The excitation energy creates an activated peroxide-containing supercritical medium, wherein radical formation and reaction kinetics are enhanced. In this example, the lamp 138 provides a wavelength of between about 150 nm and 500 nm, more preferably between about 150 nm and 200 nm, and most preferably between 155 and 175 nm.

Preferably, applying the excitation energy may further include exposing the activated peroxide-supercritical solution to at least one of a heat source and a mechanical agitation source. Heat sources 118 of the invention may preferably include at least one of a wafer stage heater, an infrared heater lamp source, a process vessel with heated interior surfaces, and a recirculating heater or heat exchange coils immersed in the processing fluid. In such embodiments, preferably applying the excitation energy includes heating the peroxide-containing medium to between about 40° C. and 150° C. Mechanical agitation sources may be used, where the mechanical agitation sources of the invention include at least one of a transducer element (capable of generating mechanical vibration to the wafer, and a probe member to transmit said mechanical vibration to the wafer), a rotation mechanism, an orbit mechanism, and the like.

In this example, the peroxide containing medium includes at least one of an inorganic peroxide and an organic peroxide and may further include a radical initiator and/or ozone. A description of peroxide sources and initiators are described in U.S. patent application Ser. No. 10/159,951 having Tipton et al. as inventors and titled "Method for Removing Photoresist and Post Residue Using Activated Peroxide Followed by Supercritical Fluid Treatment" and filed on May 30, 2002 is incorporated herein by reference for all purposes. The supercritical fluid may also contain between about 0 and 15% by weight of additional additives. Additives may include, but are not limited to, at least one of acetonitrile, ethanol, methanol, isopropanol, tetrahydrofuran, methylene chloride, chloroform, 1,2-dichloroethane, diethyl ether, hexane, toluene, benzene, xylene, tertiary butyl methyl ether, 1,4-dioxane, 1,2-diethoxyethane, 1,2-dimethoxyethane, ethylene glycol, propylene glycol, ethyl lactate, acetic acid, trifluoroacetic acid, dimethylacetimide, N-methylpyrrolidinone, dimethyl formamide, and dimethyl ethanolamine. A description of preferred additives for supercritical fluid processing of wafers is described in U.S. patent application Ser. No. 10/125,614, entitled, "Additives for Cleaning Silicon Wafers with Supercritical $CO_2$," naming Reinhardt et al. as inventors, which was filed on Apr. 18, 2002, and in U.S. application Ser. No. 10/202,987, having Patrick C. Joyce et al. as inventors, filed Apr. 18, 2002, and titled "Supercritical Solutions for Cleaning Photoresist and Post Etch Residue from Low-K Materials," which both are incorporated herein by reference for all purposes.

Application of the supercritical fluid is performed for a defined processing time (step 218). In this example, applying the supercritical fluid to the wafer work surface is conducted over a period of not more than about 60 minutes, more preferably not more than about 20 minutes, most preferably not more than about 5 minutes. After the processing time, the method is done.

Since the UV lamp is in the process chamber, the UV lamp is exposed to the supercritical fluid and must be able to withstand the temperature, pressure, agitation, and heating that may be present during the supercritical fluid processing.

After the process conditions, the pressure in the process vessel is reduced, preferably after the risk of phase separation of one or more solutes from the supercritical fluid has been substantially eliminated. For example, in some instances a solute additive (or contaminant) may precipitate from the supercritical fluid once the pressure is reduced (although the pressure may still be within a supercritical range). In this case, the supercritical fluid is diluted (while under supercritical conditions) to reduce the risk of such a phase separation. A description of preferred methods and apparatus for diluting supercritical fluids is described in U.S. patent application Ser. No. 10/067,520, which was incorporated by reference above. In another example, the bulk of the additives (or contaminants) are removed prior to depressurization. A description of preferred methods for removal of solutes from supercritical fluids is described in U.S. patent application Ser. No. 10/099,555 (attorney docket number NOVLP034), entitled, "Method and Apparatus to Remove Additives and Contaminants from a Supercritical Processing Solution," naming Humayun et al. as inventors, which was filed on Mar. 13, 2002, which is herein incorporated by reference for all purposes.

After the risk of such a phase separation has passed, and the pressure reduced, the process vessel is vented and the wafer removed (step 220). Then the method is done.

In this example, a substance may be provided from the secondary source before the UV light is provided. The UV light may be used to both create free radicals from the peroxide and to directly break down the photoresist and the post etch residue.

The invention may be used for removing both positive and negative photoresist, such as novolac resin, PhoSt (poly-hydroxylstyrene), PMMA (poly-methylmethacracrylate), or the next generation lithography photoresists such as siloxane or polynoroborane. This process may be used to clean post-etch, post implant, or post CMP residue. The enhanced diffusivity of supercritical $CO_2$ allows for easy access to increasingly small feature sizes (<0.1 $\mu$m), as well as the ability to move into extremely small pores commonly found in ultra low-k dielectric materials.

Example 2

In this example, a wafer is first mounted in a supercritical process vessel (step 204). The process vessel is evacuated and the high intensity discharge lamp is activated within the supercritical process vessel (step 208). The resulting radiation, preferably in the UV range, is used to,break bonds in a photoresist and post etch residue on the wafer to form smaller molecules. By providing uniform illumination across the working surface of the wafer, the photoresist is evenly affected. After a predetermined period of UV exposure, supercritical fluid is provided to the process vessel (step 216). The supercritical fluid is used to remove the smaller molecules (step 218) from the surface and to clean the small features. The continued exposure of the supercritical fluid to the UV radiation helps to further break down the molecules and aids in their dissolution in the supercritical fluid. The supercritical fluid is then vented from the process vessel (step 220) resulting in a clean and dry wafer.

Example 3

In this example, a wafer with a partially processed film is provided to the supercritical process vessel (step 204) and a supercritical fluid with one or more cosolvents and/or additives is provided to the supercritical process vessel from the supercritical fluid source (step 216) The supercritical fluid delivers chemicals to the film on the working surface of the wafer (step 218). The high intensity discharge lamp provides light of certain wavelength within the supercritical process vessel (step 208). The radiation is of such a wavelength as to initiate or propagate a desired reaction in the film. The chemicals delivered to the film may take part in the reaction or may interact with the byproducts of the reaction and thus aid in their removal from the film In this manner the properties of the film are altered. The transport of the additives into the film matrix may be further enhanced by the swelling of the film by the supercritical fluid. The supercritical fluid may also act as a solvent for any byproducts of the process and is itself easily removed from the substrate, thus providing a process without the need for further cleaning, solvent removal, or drying (step 220).

This example includes, but is not limited to, the: 1) grafting of functional groups into polymer backbones; 2) infusion of reactant(s) into one phase of a meso, micro, or even nanophasic template followed by radiation or radical induced reaction to form a porous patterned film; 3) exposing and developing a chemical amplified resist by dissolution of the developed area to form a patterned substrate; and 4) growth of a polymer film where radiation initiates the generation of radicals and polymerization of molecules on a surface of the wafer and the supercritical fluid brings the reactants or radicals to the surface and/or removes byproducts away from the surface.

While this invention has been described in terms of several preferred embodiments, there are alterations, modifications, permutations, and substitute equivalents which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one", but rather "one or more", unless otherwise stated in the claims.

What is claimed is:

1. An apparatus for processing a wafer, comprising:
   a supercritical process vessel with an interior for holding a supercritical fluid;
   a wafer support for supporting a wafer within the interior of a supercritical process vessel to expose the wafer to the supercritical fluid; and
   a lamp, which is able to operate at supercritical fluid pressures within the interior of the supercritical process vessel to expose the lamp to the supercritical fluid.

2. The apparatus, as recited in claim 1, further comprising a supercritical fluid source connected to an inlet of the supercritical process vessel.

3. The apparatus, as recited in claim 2, further comprising a reflector within the supercritical process vessel configured in relation to the lamp to reflect light emanating from the lamp evenly over a wafer work surface when said wafer is supported by the wafer support.

4. The apparatus, as recited in claim 3, wherein the reflector is parabolic with a focal point.

5. The apparatus, as recited in claim 4, wherein the lamp is located at the focal point of the reflector.

6. The apparatus, as recited in claim 2, wherein the lamp is a high pressure lamp that has an envelope that is able to withstand pressures above 1200 psi.

7. The apparatus, as recited in claim 6, wherein the lamp envelope is spherical.

8. The apparatus, as recited in claim 7, wherein the lamp envelope is formed from quartz.

9. The apparatus, as recited in claim 2, further comprising a heater for heating the supercritical fluid to a temperature of at least 30° C., wherein the heater is connected to the supercritical process vessel.

10. A method for processing a wafer, comprising:
    placing the wafer within a supercritical process vessel;
    activating a light source, wherein the light source is within the supercritical process vessel; and
    introducing a supercritical fluid into the supercritical process vessel, wherein the light source is exposed to the supercritical fluid.

11. The method, as recited in claim 10, wherein the light alters a layer of the wafer.

12. The method, as recited in claim 11, wherein the light illuminates an entire work surface of the wafer.

13. The method, as recited in claim 12, wherein the light initiates polymerization of molecules on a surface of the wafer.

14. The method, as recited in claim 11, wherein altering the layer comprises formation of a second layer on the wafer work surface.

15. The method, as recited in claim 11, wherein altering the layer comprises removing the layer from the wafer.

16. The method as recited in claim 11 wherein the light facilitates the breakdown of specific chemical bonds in a film or portions of a film on the wafer.

17. The method, as recited in claim 10, wherein the supercritical fluid swells a layer of the wafer.

18. The method as recited in claim 10, wherein the light interacts with the supercritical fluid to generative active species, which then interact with the work surface of the wafer.

* * * * *